US005541538A

United States Patent [19]

Bacrania et al.

[11] Patent Number: 5,541,538
[45] Date of Patent: Jul. 30, 1996

[54] HIGH SPEED COMPARATOR

[75] Inventors: Kantilal Bacrania, Palm Bay; Gregory J. Fisher, Indialantic, both of Fla.

[73] Assignee: Harris Corporation, Melbourne, Fla.

[21] Appl. No.: 299,741

[22] Filed: Sep. 1, 1994

[51] Int. Cl.⁶ .................................................. H03K 5/24
[52] U.S. Cl. .............................. 327/77; 327/89; 327/563
[58] Field of Search ................................ 327/51, 52, 53, 327/56, 63, 64, 65, 66, 74, 77, 78, 89, 375, 560, 561, 563, 100; 330/252, 257

[56] References Cited

U.S. PATENT DOCUMENTS 4,763,026  8/1988  Tsen et al. ............................ 327/56
4,791,324 12/1988 Hodapp ................................. 327/66
4,794,342 12/1988 Kimura ................................. 330/252
5,347,175  9/1994 Lang et al. ........................... 327/77
5,374,859 12/1994 Doyle et al. ......................... 327/65
5,420,587  5/1995 Michel ................................. 341/156

Primary Examiner—Timothy P. Callahan
Assistant Examiner—Eunja Shin
Attorney, Agent, or Firm—Nixon, Hargrave, Devans & Doyle

[57] ABSTRACT

A comparator 10 has a first stage differential amplifier 11 coupled to a second stage, single ended differential amplifier 12. The output of the second stage is coupled to a latch input stage 15 of a latch 16. A latch replica bias circuit 20 operates the second stage at a clamp voltage corresponding to the threshold voltage of latch 16. A clock signal clk switches the second stage 12 between gain and clamp modes.

17 Claims, 8 Drawing Sheets

HIGH SPEED COMPARATOR

This invention is related to comparators, in particular a bipolar-MOS voltage comparator which is intended for use in A/D converter products or other products where a large number of comparators are required.

BACKGROUND

Prior art comparators used in A/D converters are usually either a linear mode differential circuit or an offset cancelling circuit involving switches and capacitors. The linear mode differential comparators can be designed with either bipolar or MOS devices although high speed operation usually requires bipolar devices in the signal path. The offset cancelling circuits are usually CMOS circuits that use switches and capacitors to remove the effects of the relatively large offset voltages common with small MOS devices. Regardless of the circuit topology or design, all comparators intended for use in A/D converters must meet constraints on power dissipation, circuit complexity and layout area, voltage resolution, and operating speed.

SUMMARY

The invention provides a new comparator that overcomes the disadvantages of the prior art. The invention provides a two-stage comparator, a latch with a threshold level, and a bias circuit for operating the second stage of the comparator at an output level corresponding to the threshold level of the latch. The first stage of the comparator is a linear differential amplifier with first stage inputs for receiving an analog input voltage signal and a reference voltage signal. The first stage amplifier has a differential output proportional to the difference between the analog input signal and the reference voltage signal such that this difference is amplified by a controlled amount. The second stage is also a differential amplifier. The second stage amplifier has a second stage differential signal input connected to the differential output of the first stage. The output of the second stage is a single ended output which is proportional to the second stage differential signal input. The output of the second stage is periodically switched between a clamped voltage level mode and an unclamped gain mode. The second stage output is connected to the input stage of a latch having a threshold voltage level. The second stage amplifier also has a bias input provided by a bias circuit. The latch and the bias are related as the bias circuit contains a replica of the latch input stage. As such, the bias circuit is configured to operate the second stage output during the clamped voltage level mode at an output voltage corresponding to the threshold voltage of the latch input stage.

DESCRIPTION OF THE DRAWINGS

FIG. 1-2 is a schematic of a CMOS latch;

FIG. 2 shows the bias circuit of the second stage of the comparator of FIG. 1.

DETAILED DESCRIPTION

In the following description, bipolar transistors are indicated by a Q- prefix and MOS transistors are indicated by an M- prefix. The comparator 10 of FIG. 1 has two stages 11, 12 and a latch of which only the input stage 15 is shown. The first stage 11 comprises a differential pair of NPN transistors Q1 and Q2 with load resistors R1 and R2 and current source device M1. A voltage supply Vcc2 is coupled to the common connection of R1 and R2. A first stage reference voltage $V_{REF}$ is coupled to the base of transistor Q1; the input signal $V_{IN}$ is coupled to the base of the other transistor Q2. First stage output signals are taken from the collectors of Q1 and Q2. The first stage 11 operates between a positive Vcc2 (somewhat less than 5V) and a Vee of −5V. A first stage 11 suitable for operation between either Vcc2 or Vcc of +5 and ground could also be used.

Figure 1:
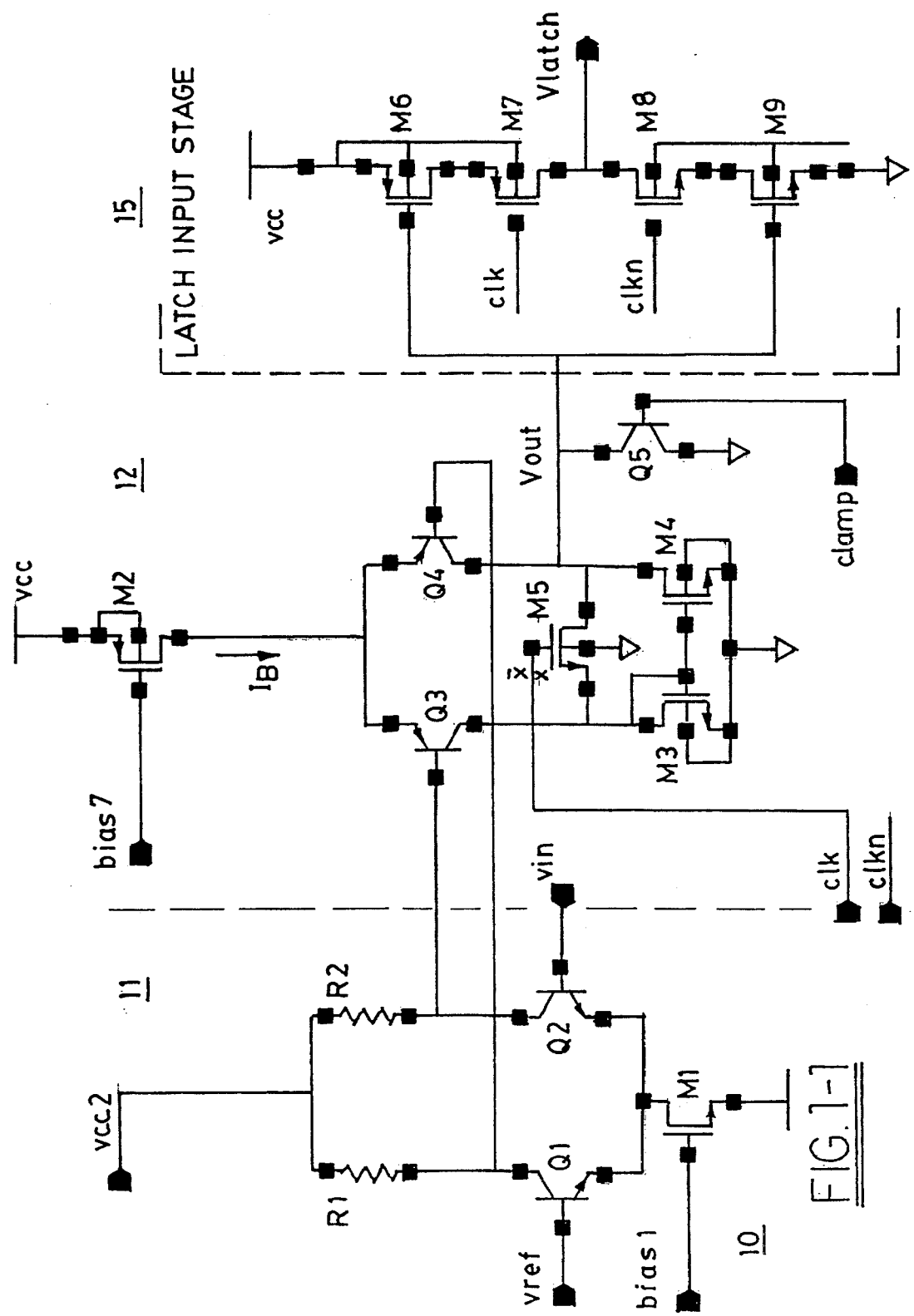
FIG. 1-1 shows a two-stage comparator and a latch input stage.

FIG. 1 does not show emitter follower buffers on the input pair but those skilled in the art will recognize that emitter followers could be used to insure a high and constant input impedance to the comparator inputs. Q1 and Q2 can be either minimum sized devices or be within a few microns of the minimum sized device depending on offset matching requirements.

The second stage 12 comprises two differentially connected PNP transistors Q3, Q4. The bases of transistors Q3, Q4 are connected, respectively, to the collectors of Q2 and Q1. Transistor M2 provides a bias current $I_B$. The emitters of Q3, Q4 are coupled to M2; the collectors of Q3, Q4 are respectively coupled to M3, M4. Transistors M3, M4 transform the differential output of transistors Q3, Q4 into a single ended output. Transistor M5 is coupled between the collectors of Q3, Q4 and is selectively operable to connect together the two collectors to provide a zero differential output signal. Transistor M5 has its gate coupled to a clock signal clk. When the signal clk is high, the collectors of Q3, Q4 are connected together; when signal clk is low, Q3, Q4 provide an output signal proportional to the difference between their respective inputs on their bases. The output of the second stage is a signal $V_{OUT}$. The signal $V_{OUT}$ is coupled to the input of latch 15.

Figures 1, 2:
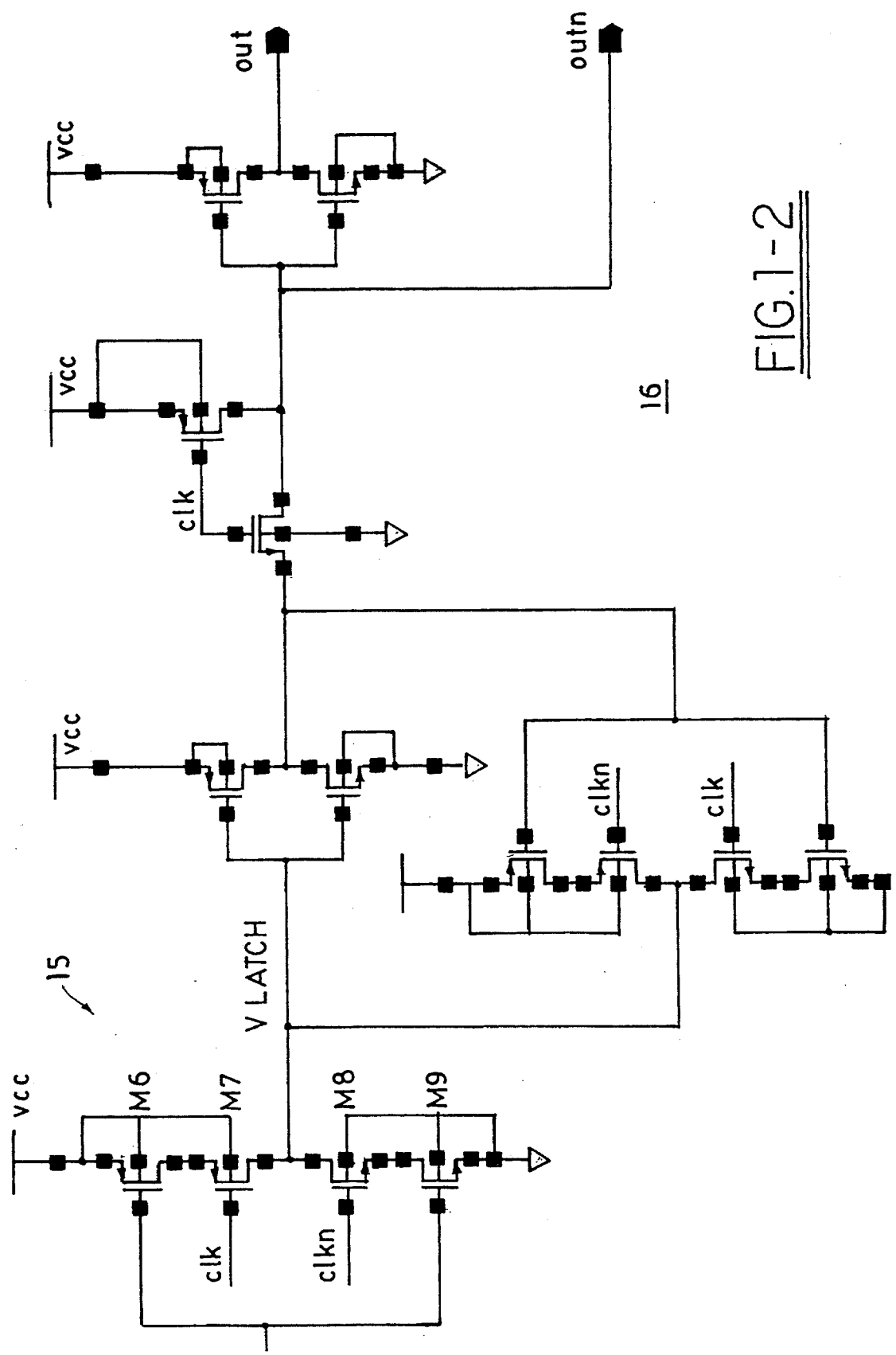
Figure 2:
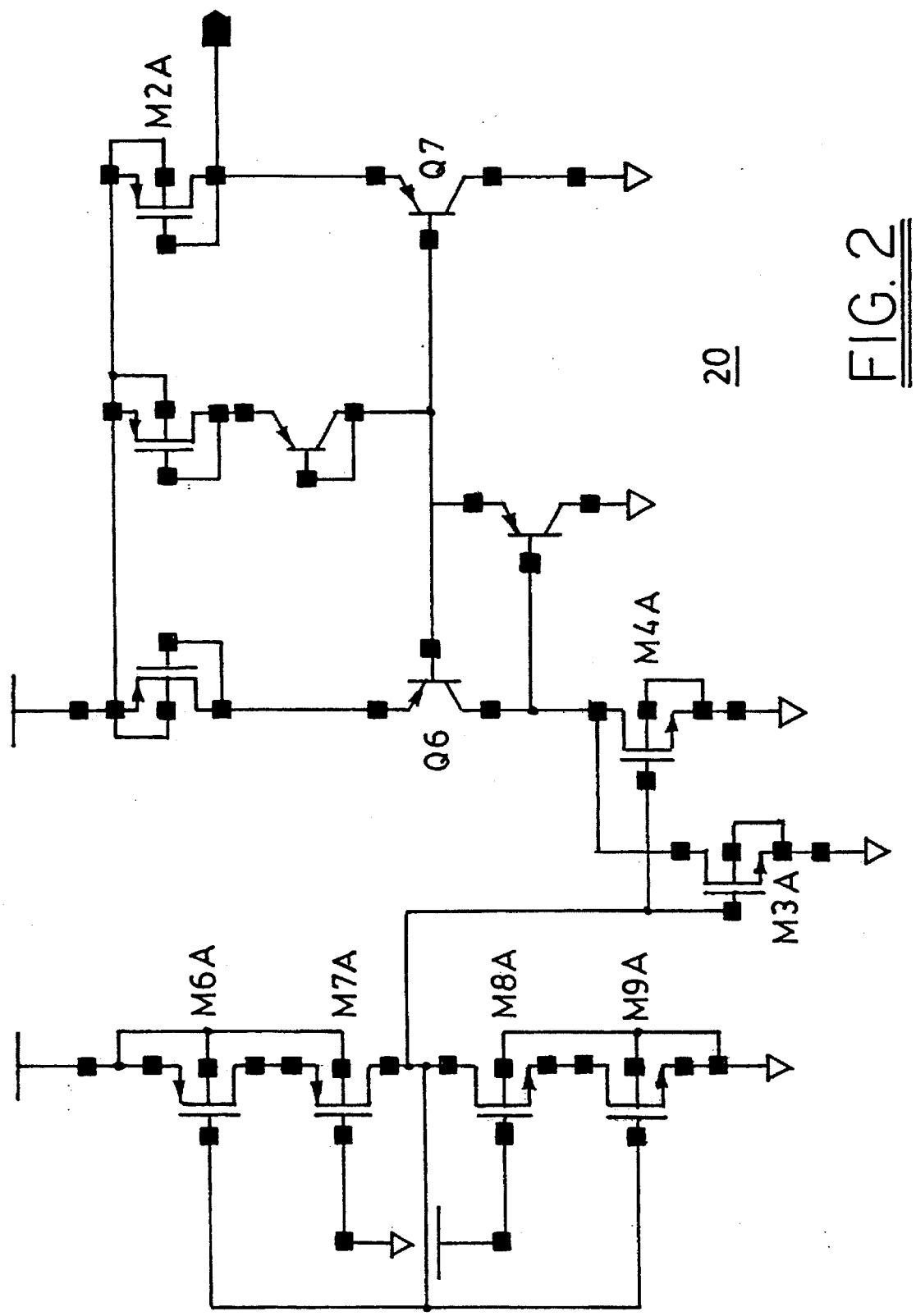

Latch input stage 15 comprising PMOS transistors M6, M7 and NMOS transistors M8, M9 that are coupled in series with each other as shown in FIG. 1. FIG. 1-2 shows the complete schematic of the latch 16 which is similar to prior art CMOS D-type latches. The latch input stage 15 uses transistors M6–M9 coupled between a voltage source Vcc (typically five volts) and ground. The latch input stage 15 has an output signal $V_{LATCH}$ that is taken from the junction of transistors M7 and M8. The transistors M7, M8 are controlled by signals clk and clkn, the latter being the inverse of the signal clk. As such, when clk is high, clkn is low and vice versa. The latch 16 is fabricated to have a controlled and predetermined threshold voltage. When the input to the latch 16 exceeds the threshold voltage, the latch output $V_{LATCH}$ falls to zero or ground. When the input is less than the threshold voltage, the latch output rises to the supply level Vcc. It is a feature of the comparator 10 that the bias current $I_B$ of the second stage 12 is determined by bias circuit 20 of FIG. 2 which uses a replica of the latch input stage 15. The bias current $I_B$ of M2 in FIG. 1 is set such that the collector voltage of Q4 during the clamp mode is set equal to the threshold voltage of the input stage of the CMOS latch (devices M6, M7, M8, and M9). From FIG. 2, MOS devices M6A, M7A, M8A, and M9A are used in a self biased mode to generate a voltage which is the latch input stage threshold voltage. These devices must be identical in geometry and physical orientation to the latch devices. The latch input stage 15 threshold voltage is applied to the gates of devices M3A and M4A in FIG. 2 which generates a bias current. Again, devices M3A and M4A must match the devices M3 and M4 in FIG. 1. The bias current through M3A and M4A is mirrored by the bipolar-MOS mirror through Q6 and Q7 to set up a drain current in M2A which in turn is mirrored in device M2 of FIG. 1. Device M2A matches the current source device M2 of FIG. 1 and so the clamped voltage at the drain of M4 in FIG. 1 is equal to the CMOS latch input stage 15 threshold voltage. This equivalence maintains itself over operating temperature variations and over manufacturing process variations. It also allows faster clocking of the comparator and latch as the comparator output is always reset during the clamp mode to the latch threshold and time does not have to be allotted for slewing past the threshold from the wrong polarity.

The clamp device M5 (which selectively couples together the collectors of the second stage differential pair) by itself only sets the output voltage to a level which corresponds to a zero differential input voltage. The value of this clamped output voltage is set by the bias current $I_B$ and the characteristics of the devices M3 and M4.

The use of the replica bias circuit 20 to provide a bias voltage to M2 results in a value of $I_B$ such that the clamped output voltage is equal to the threshold level of the latch 15 input stage. Without the replica bias circuit 20, the clamped output voltage of the second stage will not be equal to the threshold level; it may be approximately equal (within ½ volt or so) but will vary over temperature and will vary with different manufacturing lots.

The second stage 12 operates in either a clamp mode or an open loop high gain mode as explained hereinafter. The supply voltage Vcc2 is provided by a separate bias circuit (not shown) for this implementation and is chosen to be some voltage less than Vcc such that the second stage will operate in the linear mode. The second stage 12 operates between ground and +5V and includes the input pair Q3 and Q4 with the MOS loads M3 and M4. The bias current, $I_B$, is provided by M2 along with the bias circuit 20 of FIG. 2. Device M5 switches the second stage between a high gain open loop mode and a low impedance clamped mode. When the clock signal clk is high the collectors of Q3 and Q4 are tied together and forced to the same voltage. This is the clamped mode. Using a PNP differential pair for the second stage implies that the clamp voltage should be less than Vcc/2 in order to give a symmetrical signal swing without saturating the bipolar input device Q4. This requires that the latch stage threshold voltage also be less than Vcc/2. This can be accomplished by using minimum sizes for both the PMOS and NMOS devices due to the differences in the N and P channel transconductances. Using minimum sized devices also improves the comparator response time since the gate capacitance loading on the output stage is also minimized.

The high gain open loop mode of the comparator 10 occurs when the clock signal of FIG. 1 goes low. A low clock signal clk on the gate of M5 turns M5 off and the Q3 and Q4 collectors are free to change in response to the voltage differential present on their bases. In the open loop mode devices M3 and M4 convert the differential signal into a single ended output at the collector of Q4. Device Q5 is used to prevent the collector voltage of Q4 from going positive enough to cause Q4 to saturate. The second stage 12 is followed by CMOS latch 15. The latch 15 follows its input when the comparator 10 is in the high gain mode and must latch the data as the comparator 10 returns to the clamp mode.

A key feature of the second stage 12 is the use of M5 and the clamp mode. During the clamp mode the output is forced to a voltage which corresponds to a differential input of zero volts. This enhances the response time of the comparator 10. When the clamp is released, the output only needs to slew from a zeroed output level instead of slewing from a latched output level which could be of maximum amplitude in the opposite polarity. This is accomplished by the use of M5 to clamp the collectors of Q3, Q4 and by assigning the task of providing the regenerative latching to the CMOS latch 16 instead of including the function in the output stage of the comparator.

The use of device M5 in comparator 10 as a switching device will cause an offset error at the moment when comparator 10 is switched from the clamp mode to the high gain mode. As in prior art switching circuits, some level of offset will occur as the device M5 is switched off due to unequal charge pumping to the drains of M3 and M4. The new comparator of FIG. 1, however, is much more tolerant to clock signal feed through due to the DC coupled nature of the circuit. Any charge pumping that occurs from the gate of device M5 to the drains of M3 and M4 will be redistributed as those node voltages settle.

The comparator 10 and bias circuit 20 have been simulated over temperature and process variations. An example of the comparator 10 response is given by the waveforms plotted in FIG. 3. The clock input is a 0 to 5V square wave with a 20 nsec period and is the top waveform of the plot. This simulation included a TTL input buffer and the full clock buffer with full clock loading. The analog input is a pulse with a +/–4 mV overdrive around the comparator reference input which was set to 0V. The comparator output, $V_{OUT}$ of FIG. 1, is plotted along with the CMOS latch stage output $V_{LATCH}$.

The simulation starts with the comparator in the clamp mode and the latch output high. At 10 nsec the clock goes low and the comparator goes into the high gain mode. $V_{OUT}$ moves positive away from the clamp voltage which is the correct polarity since $V_{OUT}$ is inverted with respect to the input voltage. As $V_{OUT}$ moves away from the clamp voltage the latch stage output $V_{LATCH}$ also moves. During the gain mode $V_{OUT}$ does not move enough to force the latch output to 0V, but the latch correctly latches the data during the next clamp mode. The input changes polarity relative to the reference at 40 nsec and is then sampled by the comparator during the next gain mode starting at 50 nsec. $V_{OUT}$ now moves negatively away from the clamp voltage and $V_{LATCH}$ goes high. The next input change is at 80 nsec and $V_{OUT}$ and $V_{LATCH}$ can be seen to function correctly.

Figure 3:
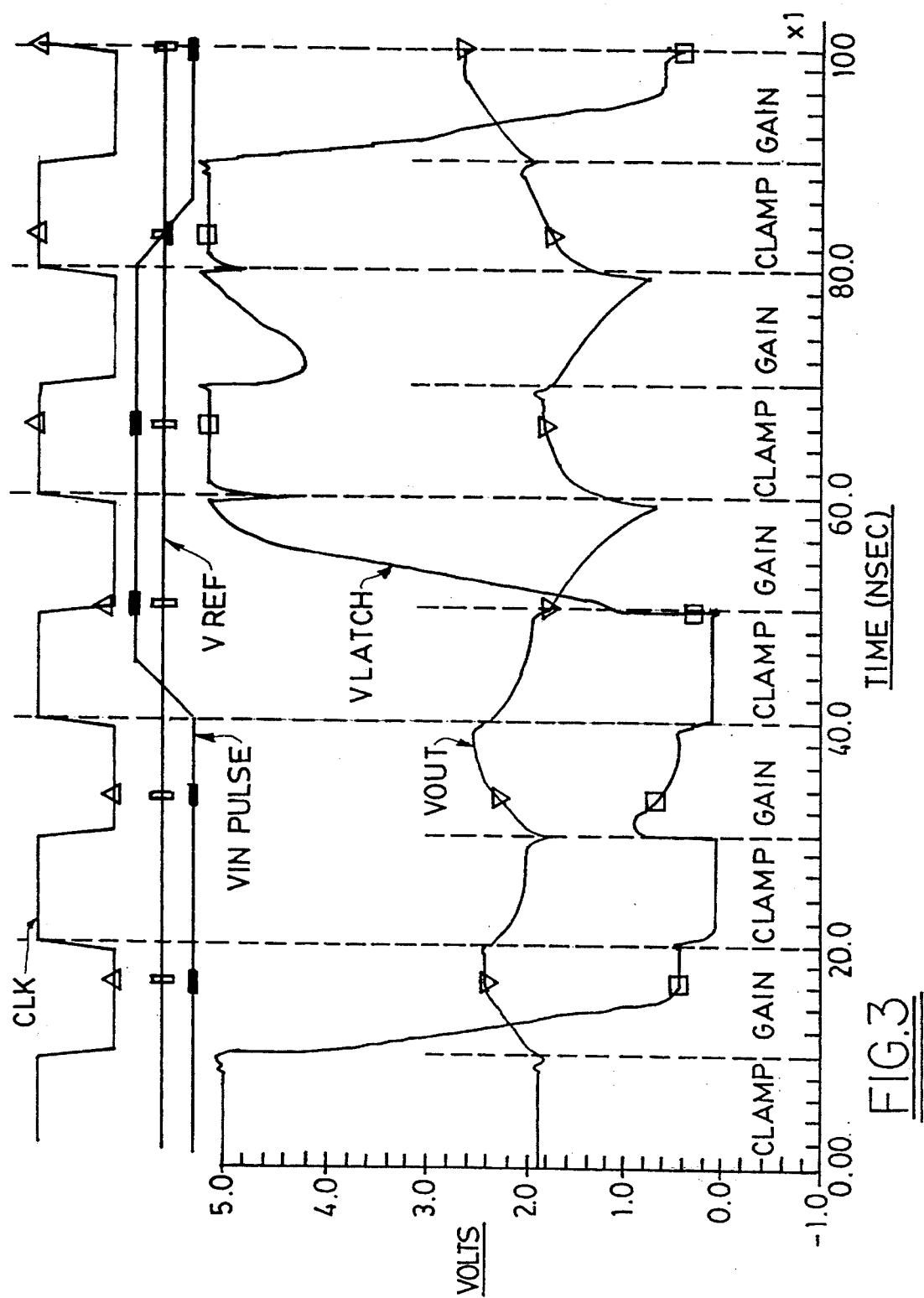
FIG. 3 shows a timing diagram of a simulation of the operation of the comparator and latch of FIG. 1.
Figure 4:
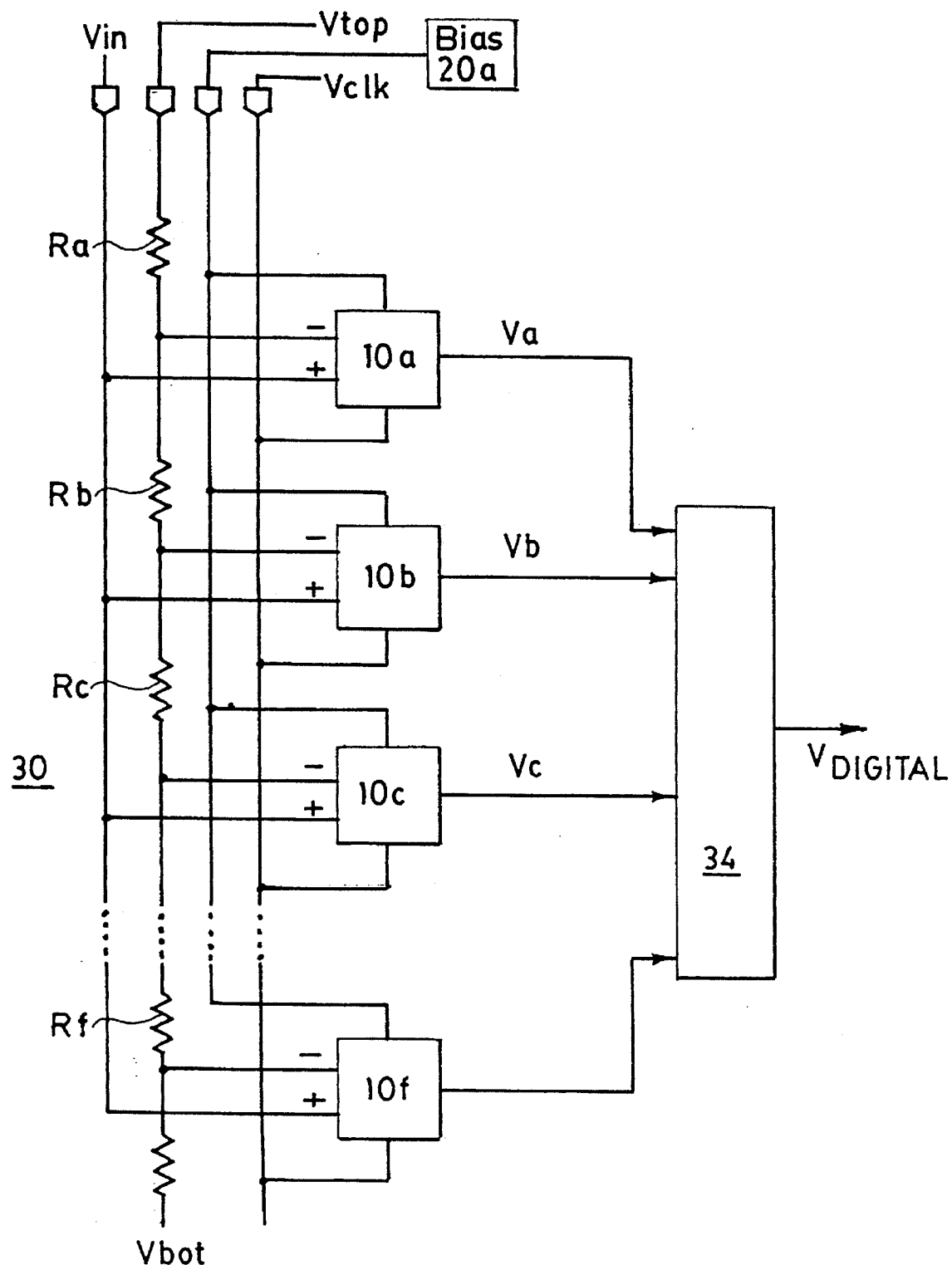
FIG. 4 is a schematic of an A/D converter using comparators of FIG. 1.

With reference to FIG. 4, the comparator 10 is useful in an N bit A/D converter 30 that uses comparators 10a–n and a single bias circuit 20a each respectively similar to comparator 10 and bias circuit 20 of FIGS. 1 and 2. The signal $V_{IN}$ is distributed to each of the comparators 10a–f. At each comparator, the input signal $V_{IN}$ is compared to a different level of reference voltage. The different levels of reference voltage result from the voltage drop across the series connected resistors $R_a$–$R_f$ that are connected between $V_{TOP}$ and $V_{BOT}$. Each of the resistors $R_a$–$R_f$ is of the same value. The outputs of comparators 10a–f are the respective signals $V_a$–$V_f$. Each of the signals $V_a$–$V_f$ is a digital signal having a binary value of 1 or 0. As indicated in FIG. 3, the actual voltage values of the signals $V_a$–$V_f$ varies between 0 volts and 5 volts. The signals $V_a$–$V_f$ are input into an output controller 34 where they are output into a stream of sequential digital signals. The output stream of digitals signals, $V_{DIGITAL}$ is an N bit binary signal corresponding to the instantaneous magnitude of the input signal $V_{IN}$.

The converter 30 includes all input and output functions and electrostatic discharge protection (not shown) normally incorporated in a converter but omitted from this description for the sake of clarity.

The new comparator 10 makes use of bipolar devices, both NPN and PNP and CMOS devices. The latter is made possible by the use of a bi-MOS process such as described in U.S. patent application Ser. No. 07/984,187, filed Nov. 20, 1992 and assigned to the assignee of this invention. The comparator 10 achieves several desirable features of both bipolar and MOS comparators. The bipolar devices in the signal path give the voltage resolution and low offset, as well as the high speed, that are common with bipolar comparators. The use of the MOS devices in the second stage along with the bias circuit 20 of FIG. 2 give CMOS signal swings in only two stages. This allows the remainder of the signal path to be CMOS logic which gives the comparator the area and power advantages of MOS circuitry.

Figure 5:
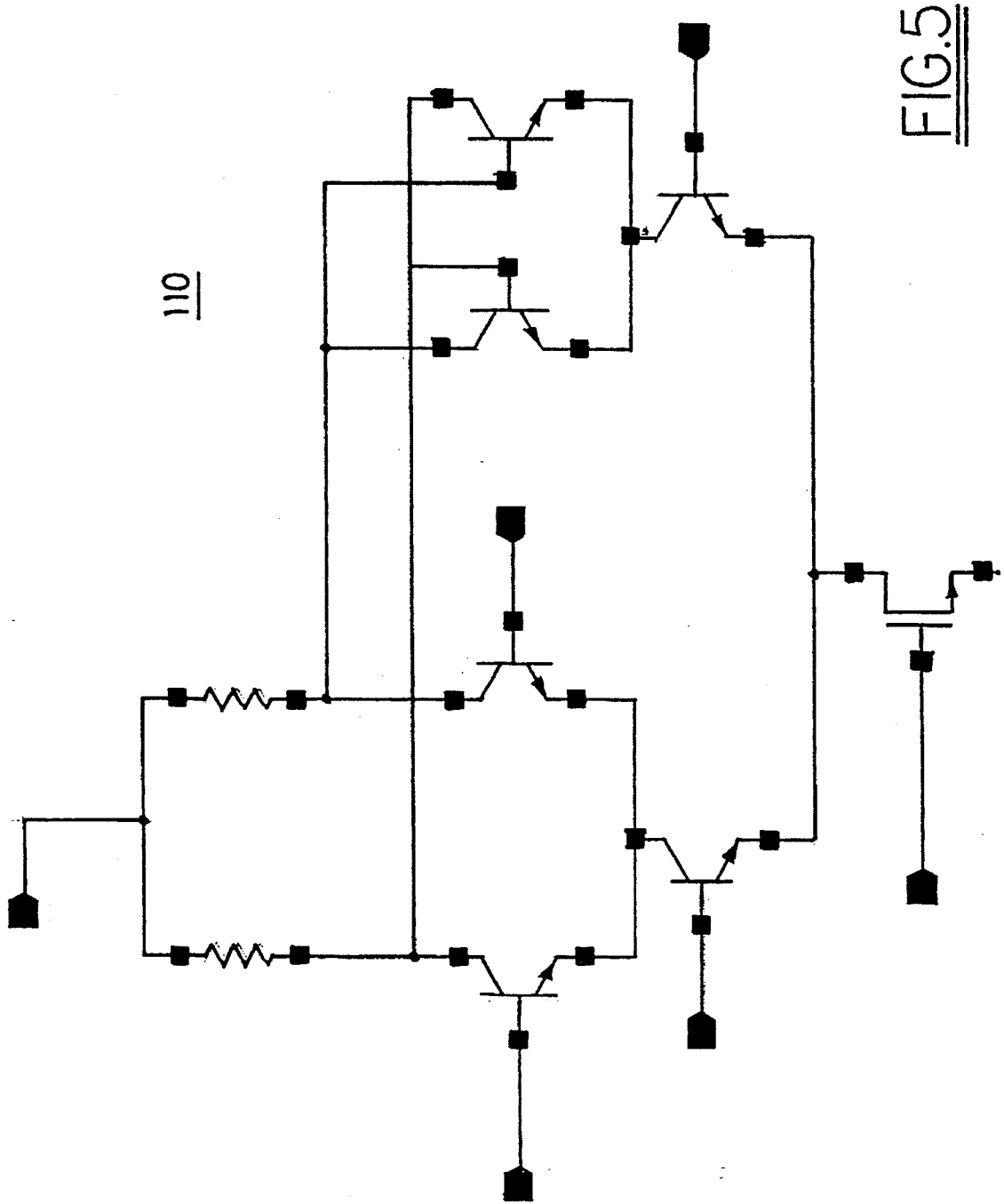
FIG. 5 is a schematic of an alternative first stage.
Figure 6:
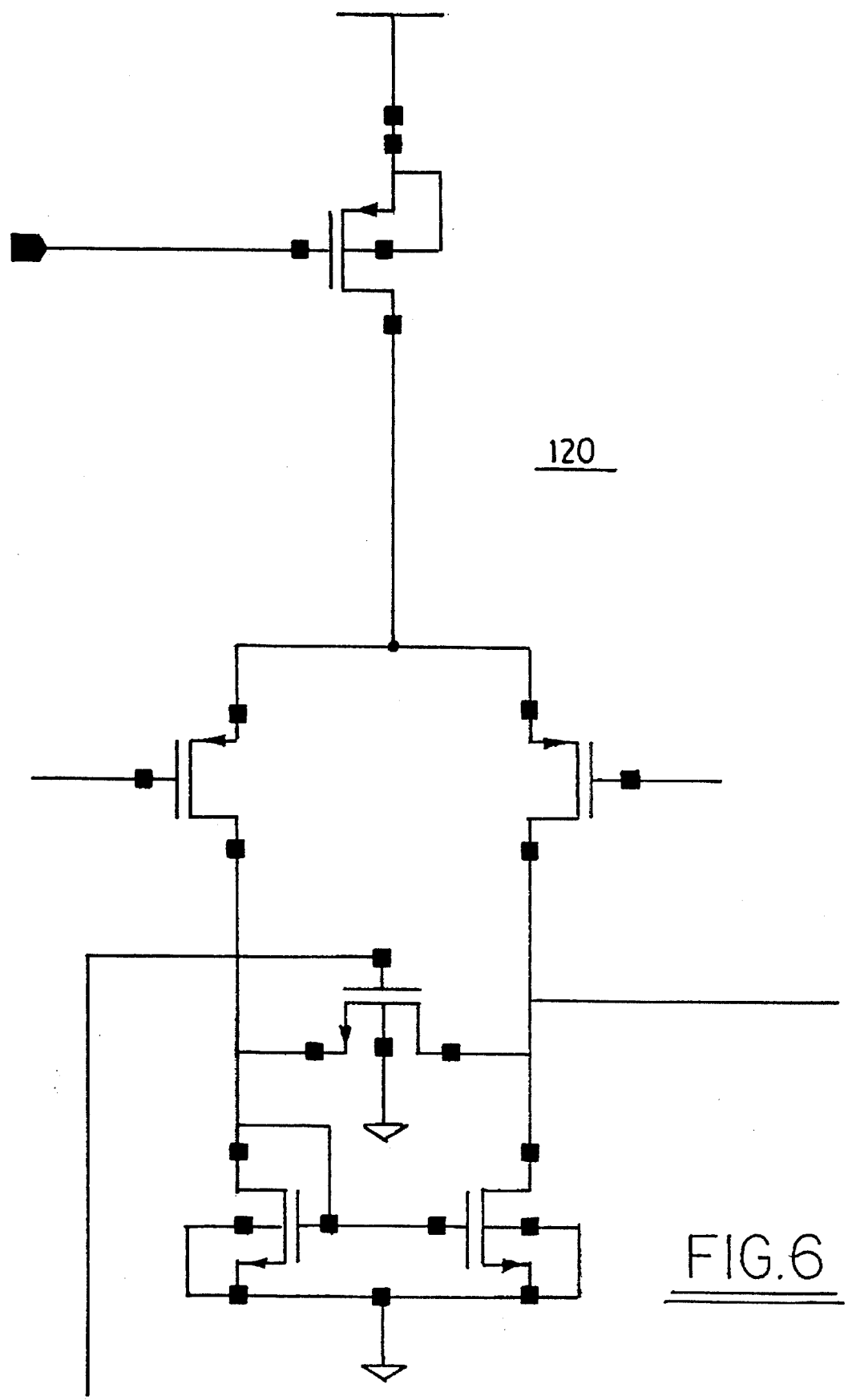
FIG. 6 is a schematic of an alternative second stage.
Figure 7:
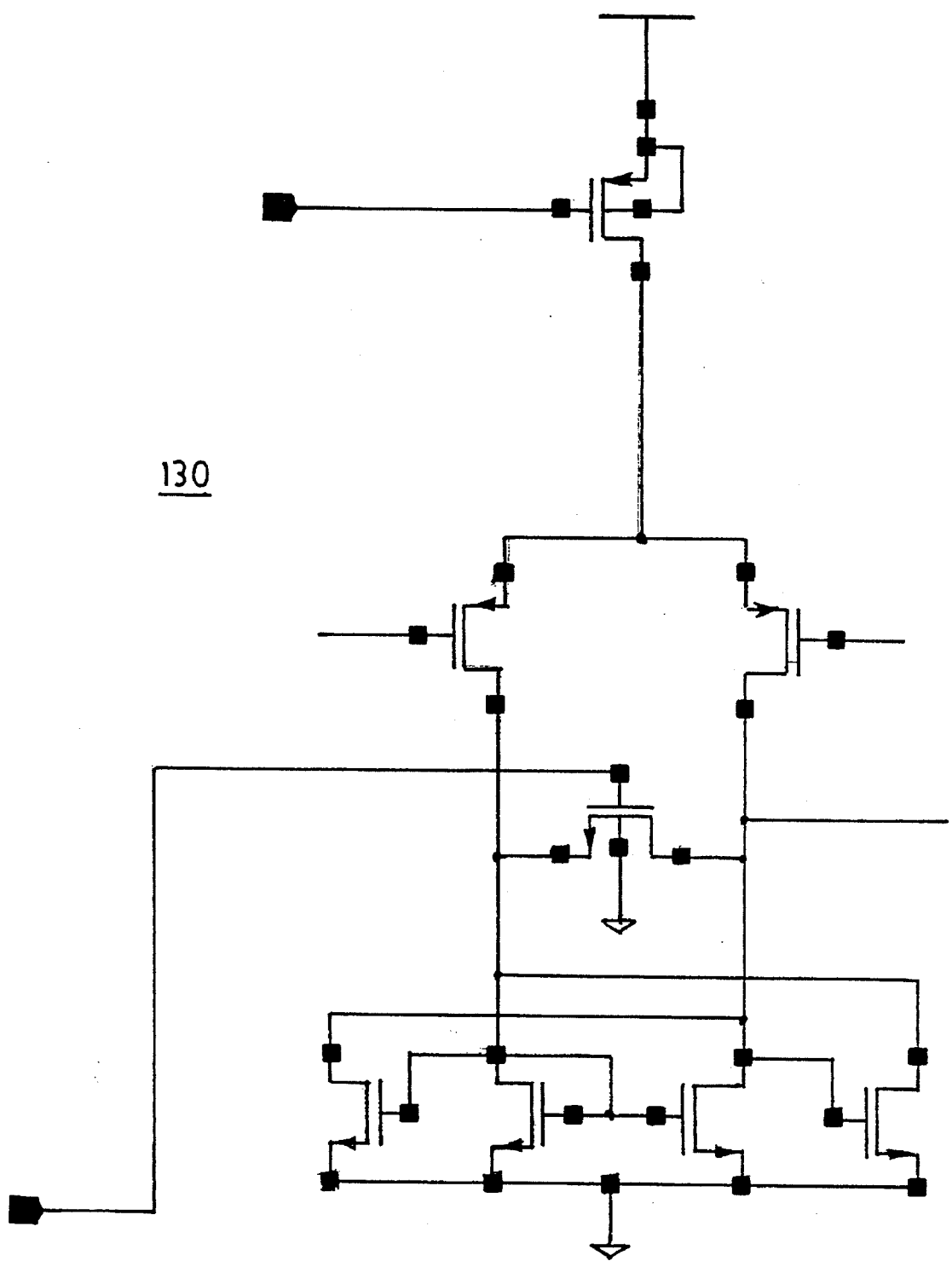
FIG. 7 is a schematic of another second stage.

Having thus described the preferred embodiment of the invention, those skilled in the art will appreciate that further modifications, additions, deletions and changes can be made to those embodiments without departing from the spirit and scope of the invention as set forth in the following claims. For example, and without limitation, the first stage 11 may have a latch configuration 110 as shown in FIG. 5; the second sturge 12 may comprise an all MOS transistor circuit 120 as shown in FIG. 6; the second stage may also comprise a regenerational feedback circuit 130 as shown in FIG. 7.

What we claim is:

1. A comparator comprising:

a two-stage differential amplifier having first and second stages, said first stage having one input for receiving an input signal and another input for receiving a reference voltage and a first stage output for providing a first stage output signal representative of the difference between the input signal and the reference voltage;

said second stage having a differential amplifier switchable between gain and clamp modes and having a second stage input coupled to the first stage output of the first stage, a bias input and a second stage output for providing a second stage output signal representative of the second stage input signal, wherein the second stage output is set to a clamp level voltage during the clamp mode;

means for switching the second stage between a gain mode and a clamped mode; and a latch input stage having an input coupled to the second stage output, said latch input stage having a threshold level voltage and having a latch output for providing a latch output signal representative of whether the latch input is greater than or less than the threshold level voltage of the latch, wherein the clamp level voltage is the same as the threshold level voltage.

2. The comparator of claim 1 wherein the latch output is a first level when the latch input is below the threshold level voltage and a second level different from the first level when the latch input is above the threshold level voltage.

3. The comparator of claim 1 wherein the second stage comprises a differential pair of transistors.

4. The comparator of claim 3 wherein the differential pair of transistors comprise a differential pair of bipolar transistors, each bipolar transistor having an emitter, a base and a collector.

5. The comparator of claim 4 wherein the collectors of the transistors are selectively coupled together during said clamp mode to set the output of the second stage to the clamp level voltage and corresponding to a differential input voltage of zero.

6. The comparator of claim 1 further comprising a replica bias circuit corresponding to said latch coupled to said bias input for generating a bias current for said second stage, said bias current establishing the clamp level voltage for said clamp mode.

7. A comparator comprising:

an amplifier having gain and clamp modes comprising a differential input for receiving a differential input signal, a differential pair of transistors coupled to the input, a bias input for providing a bias current to the differential pair and an amplifier output providing an output signal representative of the differential input signal, wherein the amplifier output is set to a clamp level during the clamp mode;

means for switching the amplifier between the gain mode and the clamp mode; and a latch input stage having an input coupled to the output of said differential pair, said latch input stage having a threshold level and having a latch output for providing a latch output signal representative of whether a latch input signal is greater than or less than the threshold level of the latch, wherein the latch is the replica of a bias circuit coupled to the bias input which generates the bias current and wherein the clamp level corresponds to the threshold level of the latch.

8. The comparator of claim 7 wherein the differential transistors are bipolar transistors each with an emitter, base and collector, the emitters are coupled to the bias input and a third transistor selectively couples the collectors of the bipolar transistors together.

9. The comparator of claim 8 wherein the third transistor is a MOS transistor and the gate of the third transistor is coupled to a clock signal for periodically coupling the collectors together.

10. An analog to digital converter comprising:

an input for receiving an analog signal;

a plurality of comparators coupled to the input signal for comparing the analog signal to a plurality of signals of different levels for converting the analog signal into a digital signal representative of the magnitude of the analog signal, each of said comparator comprising a two-stage differential amplifier having first and second stages, said first stage having a first stage input for receiving a first stage input signal corresponding to a predetermined portion of said analog input signal and a first stage output for providing a first stage output signal representative of the first stage input signal;

said second stage having a differential amplifier having gain and clamped modes, a second stage input coupled to the first stage output of the first stage, a bias input and a second stage output for providing a second stage output signal representative of the second stage input signal, wherein the second stage output is set to a clamp voltage during the clamped mode;

means for switching the second stage between said gain and clamped modes; and a latch input stage having an input coupled to the second stage output, said latch input stage having a threshold voltage and having a latch output for providing a latch output signal representative of whether the latch input is greater than or less than the threshold voltage of the latch.

11. The analog to digital converter of claim 10 wherein the latch output is a first level when the latch input is below the threshold voltage and a second level different from the first level when the latch input is above the threshold voltage.

12. The analog to digital converter of claim 10 wherein the second stage comprises a differential pair of transistors.

13. The analog to digital converter of claim 12 wherein the differential pair of transistors comprise a differential pair of bipolar transistors, each bipolar transistor having an emitter, a base and a collector.

14. The analog to digital converter of claim 13 wherein the collectors of the transistors are selectively coupled together and to the clamp voltage during the clamp mode to reduce the offset of the differential pair of transistors.

15. The analog to digital converter of claim 10 wherein the clamp voltage and the threshold voltage are the same.

16. The analog to digital converter of claim 15 wherein the second stage comprises a replica bias circuit corresponding to said latch coupled to the bias input for generating the clamp voltage in said second stage.

17. A method for comparing an input signal to a reference signal and latching the results of such comparison comprising the steps of:

comparing the input signal to the reference signal;

generating an output signal proportional to the difference between the input signal and the reference signal;

latching the output signal when the output signal exceeds a threshold level; and clamping the output signal at the threshold level.

* * * * *